United States Patent
Gueissaz

(10) Patent No.: US 11,190,184 B2
(45) Date of Patent: Nov. 30, 2021

(54) FORCE SENSOR, PARTICULARLY FOR A TOUCH PAD

(71) Applicant: The Swatch Group Research and Development Ltd, Marin (CH)

(72) Inventor: Francois Gueissaz, Cormondreche (CH)

(73) Assignee: The Swatch Group Research and Development Ltd, Marin (CH)

( * ) Notice: Subject to any disclaimer, the term of this patent is extended or adjusted under 35 U.S.C. 154(b) by 591 days.

(21) Appl. No.: 16/086,497

(22) PCT Filed: Jan. 25, 2017

(86) PCT No.: PCT/EP2017/051515
§ 371 (c)(1),
(2) Date: Sep. 19, 2018

(87) PCT Pub. No.: WO2017/162352
PCT Pub. Date: Sep. 28, 2017

(65) Prior Publication Data
US 2019/0103870 A1    Apr. 4, 2019

(30) Foreign Application Priority Data

Mar. 24, 2016  (EP) .................................... 16162292

(51) Int. Cl.
*G01L 1/00*     (2006.01)
*G01D 5/20*     (2006.01)
(Continued)

(52) U.S. Cl.
CPC ............. *H03K 17/97* (2013.01); *A63B 69/12* (2013.01); *A63B 71/0605* (2013.01);
(Continued)

(58) Field of Classification Search
CPC . G01D 5/14; G01D 5/20; G01D 11/24; G04F 10/00; G04F 8/08; G01M 10/00;
(Continued)

(56) References Cited

U.S. PATENT DOCUMENTS 3,588,875 A    6/1971  Gabor
3,665,126 A    5/1972  Gabor
(Continued)

FOREIGN PATENT DOCUMENTS

CN      104697678 A    6/2015
DE      103 04 595 B3    10/2004
(Continued)

OTHER PUBLICATIONS

International Search Report dated Apr. 6, 2017 in PCT/EP2017/051515 filed Jan. 25, 2017.
Office Action dated Sep. 1, 2021, in Chinese Patent Application No. 201780019809.0 (w/English-language translation) citing reference AO therein.

*Primary Examiner* — Brandi N Hopkins
(74) *Attorney, Agent, or Firm* — Oblon, McClelland, Maier & Neustadt, L.L.P.

(57) ABSTRACT

A force sensor including: a first part including a detection coil; a second part positioned opposite the first part and including: a ferromagnetic plate translationally movable relative to the first part to move towards the first part when a force is transferred to the sensor and to reduce reluctance of a magnetic circuit formed by the first and second parts in series with a variable gap; and an electronic detection circuit configured to generate a signal dependent on the reluctance of the magnetic circuit. The ferromagnetic plate is formed by an amorphous metal alloy.

12 Claims, 1 Drawing Sheet

(51) Int. Cl.
- *H03K 17/97* (2006.01)
- *A63B 69/12* (2006.01)
- *G04F 8/08* (2006.01)
- *A63B 71/06* (2006.01)
- *H03K 17/972* (2006.01)
- *G01L 1/12* (2006.01)
- *G04F 8/00* (2006.01)

(52) U.S. Cl.
CPC ............ *G01D 5/2013* (2013.01); *G01L 1/122* (2013.01); *G01L 1/127* (2013.01); *G04F 8/006* (2013.01); *G04F 8/08* (2013.01); *H03K 17/972* (2013.01); *G01L 1/00* (2013.01)

(58) Field of Classification Search
CPC . A63K 3/00; H01B 7/10; H01H 35/00; H01H 3/14; H01H 9/04; G01L 9/16; H01F 21/02; G01P 15/11; H03K 17/96
See application file for complete search history.

(56) References Cited

U.S. PATENT DOCUMENTS

| | | |
|---|---|---|
| 3,676,696 A | 7/1972 | Leu et al. |
| 4,696,192 A | 9/1987 | Yamashita, et al. |
| 5,524,490 A | 6/1996 | Lautzenhiser et al. |
| 2010/0320066 A1 | 12/2010 | Rosenau et al. |
| 2012/0262263 A1 | 10/2012 | Furukawa et al. |
| 2016/0176702 A1* | 6/2016 | Pagani .................. G01L 9/0045 257/419 |

FOREIGN PATENT DOCUMENTS

| | | |
|---|---|---|
| EP | 0 207 512 A2 | 1/1987 |
| EP | 2 267 415 A2 | 12/2010 |
| FR | 1.177.499 A | 4/1959 |

* cited by examiner

FORCE SENSOR, PARTICULARLY FOR A TOUCH PAD

CROSS-REFERENCE TO RELATED APPLICATIONS

This is a National phase Application in the United States of International Patent Application PCT/EP2017/051515 filed on Jan. 25, 2017 which claims priority on European patent application No. 16162292.3 filed on Mar. 24, 2016. The entire disclosures of the above patent applications are hereby incorporated by reference.

FIELD OF THE INVENTION

The invention relates to a sensor suitable for detecting a force exerted on a pad, called touch pad, of a swimmer timing system. Such a sensor also can be considered to be a detector of a movement of the pad caused by the application of the force. Of course, even though the force/movement sensor is particularly suitable for the aforementioned use, it is suitable for all types of applications requiring the detection of a force or a movement.

BACKGROUND OF THE INVENTION

Conventionally, a touch pad is fixed to the finishing wall of a lane of a swimming pool. When a swimmer exerts a pressure thereon that is detected by a force sensor, a timer measuring the time of the swimmer stops or records an intermediate time.

Force sensors suitable for this use are known from application U.S. Pat. No. 3,584,169. This application discloses force sensors in the form of wires extending along the pad, between the pad and the finishing wall. Each wire comprises two opposing metal strips, one of which is curved in order to avoid any contact between the two strips.

When a swimmer exerts a force on the pad towards the finishing wall, at least one portion of one of the wires is compressed, the metal strips of said wire then coming into contact with each other. An electrical detection circuit comprising the wire then closes.

A disadvantage of this type of sensor is that it does not allow the point on the pad at which the swimmer exerted a pressure to be located. Another disadvantage is that a significant force has to be exerted on the pad in order for the metal strips to come into contact.

There is therefore a need for force sensors that are more sensitive and that can be positioned in matrix form on or facing the pad in order to allow the impact of a swimmer to be located.

Of course, such sensors also must have a low reaction time, so as to allow precise timing of the swimmers. Furthermore, such force sensors must be compact, thin, submersible and resistant to impacts and to the potentially corrosive agents present in swimming pool water, such as chlorine.

SUMMARY OF THE INVENTION

The aim of the present invention is to address all or part of the aforementioned needs.

To this end, the invention relates to a force sensor comprising:
 a first part comprising a detection coil;
 a second part positioned opposite the first part and comprising:
  a ferromagnetic plate that is translationally movable relative to the first part so as to move towards said part when a force is transferred to the sensor and to reduce the reluctance of a magnetic circuit formed by said two parts in series with a variable gap;
  an electronic detection circuit configured to generate a signal dependent on the reluctance of the magnetic circuit.

The phrase "the plate is translationally movable relative to the first part" is understood to mean that the plate is translationally movable in a reference frame in which the first part is fixed. Therefore, reference is made to relative movements between the plate and the first part. Such a reference frame is not necessarily a terrestrial reference frame. Indeed, the plate clearly can be fixed in a terrestrial reference frame, and the first movable part.

When the sensor according to the invention is placed between a finishing wall of a swimming pool and a touch pad, a force exerted on the pad in the vicinity of the sensor is fed back to said sensor. This force causes the plate to move relative to the first part comprising the detection coil. A modification in the length of the gap of the magnetic circuit then follows, which is the source of a variation of the reluctance of said magnetic circuit.

Thus, by means of the electronic detection circuit connected to the terminals of the coil and allowing an output signal to be generated that is dependent on the reluctance of the magnetic circuit (dependent on the gap), it is possible to determine whether the pad has experienced a force (i.e. whether it has moved or has moved sufficiently for this movement to be detected).

Advantageously, several sensors according to the invention are distributed within the space between the finishing wall and the pad, for example, in matrix form, in order to determine at which point a swimmer touched the pad. The higher the number of sensors, the higher the locating accuracy.

Furthermore, the force sensor according to the invention is such that the ferromagnetic plate is formed by an amorphous metal alloy. The use of amorphous metal for the plate has numerous advantages.

In particular, amorphous metal has very high relative magnetic permeability, of approximately 1,000,000. In particular, the family of cobalt-iron-nickel-boron-silicon amorphous alloys exhibits very high relative magnetic permeabilities, of approximately 1,000,000. However, the reluctance of the magnetic circuit is equal to the sum of the reluctances of the segments formed by the first part (f), the plate (m) and the gap (e), namely $L_f/\mu_0\mu_f S_f + L_m/\mu_0\mu_m S_m + L_e/\mu_0 S_e$, where L represents the length of the magnetic circuit segment, μ represents its relative magnetic permeability, S represents its section and $\mu_0$ represents the magnetic permeability of the vacuum. In order to increase the dependence of the reluctance of the circuit to the gap, and thus the sensitivity of the sensor, it is therefore necessary to minimise the sum of the reluctances of the solid parts $L_f/\mu_0\mu_f S_f + L_m/\mu_0\mu_m S_m$ relative to the reluctance of the gap $L_e/\mu_0 S_e$. The use of an amorphous metal plate, which has very high relative magnetic permeability of approximately 1,000,000, allows the contribution of the reluctance of the plate to be reduced.

Furthermore, by selecting a material with high relative magnetic permeability for the first part (excluding the detection coil), for example a ferrite having a high relative magnetic permeability of approximately 10,000, it is possible to approximate the total reluctance of the magnetic circuit by that of the gap $L_e/\mu_0 S_e$.

Amorphous metal also exhibits low magnetic creep. Inside the plate, an induced magnetic field therefore is quickly established after excitation of the detection coil. In a preferred embodiment, the variation in the reluctance of the magnetic circuit is measured using short pulses periodically applied to the coil placed in the variable reluctance magnetic circuit. The reluctance variations can be detected upon each new pulse. By virtue of the low magnetic creep of the amorphous metal, it is possible to implement a train of pulses with durations below several hundred nanoseconds, at a frequency of more than 10,000 Hertz. This corresponds to a sensor latency time below 100 microseconds, allowing precise timing of the swimmers to be carried out. Furthermore, each pulse represents energy expenditure of less than one nanojoule, that is consumption below 10 microwatts. Therefore, the consumption of a set of sensors on a touch pad is limited. It is to be noted that the use of a short pulse train mainly allows current consumption to be reduced.

Furthermore, the force sensor according to the invention can comprise one or more of the following features, according to all the technically possible combinations.

According to one non-limiting embodiment, the plate is formed by an amorphous metal alloy of the 2714A type based on cobalt-iron-nickel-boron-silicon ($Co_{69}Fe_4Ni_1B_4Si_{15}$).

According to one non-limiting embodiment, the thickness of the amorphous metal plate is between 20 and 200 micrometres, and particularly between 50 and 75 micrometres. In practice, the amorphous metal plate is optionally formed by a plurality of thin superimposed layers in order to reach the desired thickness. The greater the thickness, the lower the magnetic leakage on the plate, and the greater the magnetic field inside the plate. However, high thickness entails a bulky sensor, which is restrictive within the context using the sensor for timing swimmers. It has been experimentally observed that a thickness between 20 and 200 micrometres, and more specifically between 50 and 75 micrometres, is a good compromise for a compact sensor having low magnetic leakage.

According to one non-limiting embodiment, the first part comprises a ferrite core, the coil being placed in said core. As previously described, ferrite has high relative magnetic permeability of approximately 10,000, which allows the contribution of the reluctance of the first part to be reduced. It is to be noted that the core alternatively could be made of ferromagnetic amorphous metal.

According to one non-limiting embodiment, the coil and the core are substantially flat. In this case, reference is made to a flat coil or a pancake coil opposing a long coil or solenoid. This type of coil allows the overall size of the sensor to be limited.

According to one non-limiting embodiment, the second part comprises a base fixed to the first part, the base comprising suspension means rigidly connected to the amorphous metal plate, the amorphous metal plate being movable relative to the first part by means of said suspension means. The sensor then forms a block, part of which is movable. In one embodiment, the first part is fixed to the pad of the timing system, opposite the wall of the swimming pool. When the pad moves towards the wall by means of pressure from a swimmer, the sensor is compressed and the amorphous metal sheet moves towards the first part. Alternatively, the first part is fixed to the swimming pool, the second part is fixed to the pad, or even the second part is fixed to the swimming pool.

According to one non-limiting embodiment, the suspension means are arms formed by cutting in the base, each arm comprising an end comprising a contact pad, the contact pads being fixed to the first part. This is a simple means of forming suspension means. The contact pads act as abutment points against the first part, the remainder of the second part is suspended. Alternatively, the suspension means could be springs attached to both the base and to the first part.

According to one non-limiting embodiment, the first part comprises sealing means and a structure comprising a cavity, the coil and the detection circuit being enclosed inside the cavity by the sealing means. Thus, the coil and the detection circuit are protected from impacts and from water.

According to one non-limiting embodiment, the sealing means are a plate made of glass or ceramic that is fixed (soldered or adhered, for example) to the structure. With these materials, the magnetic fluxes between the first and the second part of the sensor are not disrupted. Furthermore, glass and ceramic, or other crystalline inorganic materials, are materials that are resistant to water and to corrosive agents such as chlorine, as opposed to an organic material such as rubber, for example, which would deteriorate over time.

The invention further relates to a swimmer timing system, comprising a pad positioned on a finishing wall of a swimming pool and at least one sensor according to the invention positioned between the finishing wall and the pad so that a force exerted on the pad is transferred to the sensor comprising the amorphous metal sheet.

In one non-limiting embodiment, the timing system comprises a plurality of sensors arranged in matrix form between the finishing wall and the pad. Thus, on the basis of the sensor(s) that react, it is possible to locate the impact of the swimmer on the pad.

BRIEF DESCRIPTION OF THE DRAWINGS

Further features and advantages will become clearly apparent from the following description, which is provided by way of non-limiting example, with reference to the accompanying drawings, in which.

DETAILED DESCRIPTION OF THE PREFERRED EMBODIMENTS

Figure 1:
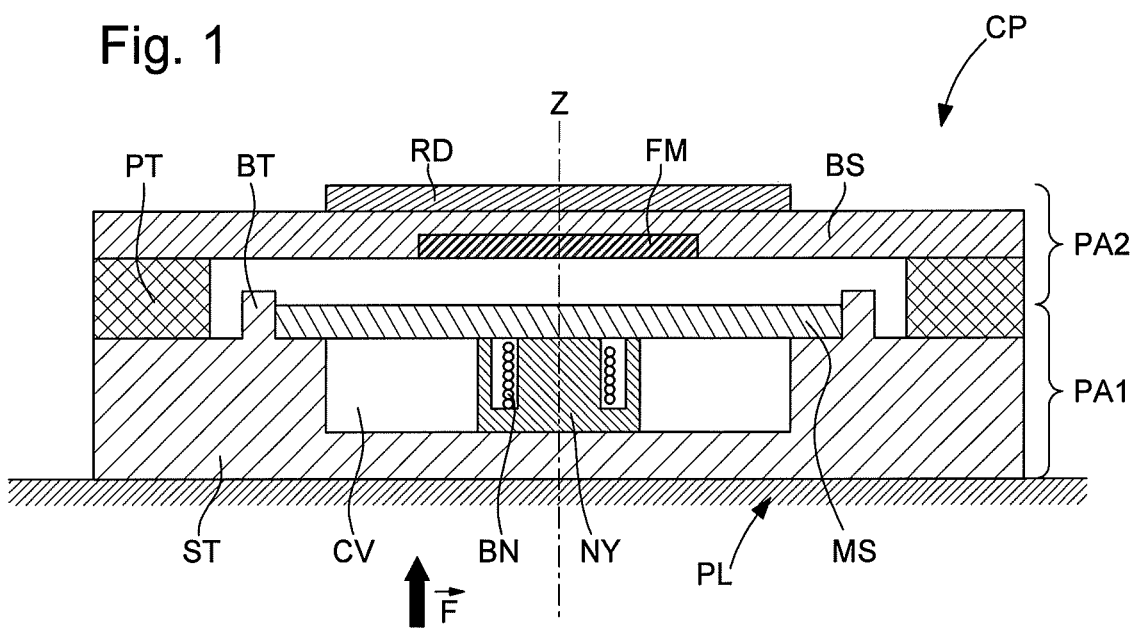
FIG. 1 is a sectional view of an assembly of a first part and a second part of a force sensor according to one embodiment of the invention.

As shown with reference to FIG. 1, a force sensor CP according to the invention comprises:
 a first part PA1 particularly comprising a coil BN and a detection circuit (not shown) connected to the terminals of the coil BN;
 a second part PA2, opposite the first part PA1, particularly comprising a ferromagnetic plate FM made of amorphous metal alloy, particularly of the 2714A type based on cobalt-iron-nickel-boron-silicon ($Co_{69}Fe_4Ni_1B_4Si_{15}$).

The term "opposite" is understood to mean that the plane R along which the amorphous metal plate FM extends is substantially orthogonal to the axis Z of the coil BN.

In the embodiment shown in FIG. 1, the first part PA1 and the second part PA2 are fixed to each other. More specifically, and as described in further detail hereafter, the second part PA2 comprises suspension means BR, PT that are fixed to the first part PA1. The amorphous metal plate FM is kept suspended relative to the coil BN by means of these suspension means BR, PT. The amorphous metal plate FM is then able to translationally move relative to the first part PA1 along the axis Z of the coil BN, which allows it to move towards or move away from the coil BN. It is to be noted that "the plate is translationally movable relative to the first part" is understood to mean that the plate is translationally movable in a reference frame in which the first part is fixed, this reference frame not necessarily being a terrestrial reference frame (in a terrestrial reference frame the first part clearly can be movable). Within the context of use for timing swimmers, the sensor CP is placed between a finishing wall of a lane of a swimming pool and a pad PL of a timing system. The sensor CP is either attached to the wall or to the pad on the first part PA1 or on the second part PA2. In FIG. 1, which shows a non-limiting embodiment, the sensor CP is shown attached to the pad PL on its first part PA1. When a force F, shown in FIG. 1, is applied to the pad PL, the pad PL moves towards the wall, compressing the sensor CP. The amorphous metal plate FM and the coil BN then move towards each other via the suspension means BR, PT.

In an alternative embodiment, the first part PA1 and the second part PA2 are not fixed to each other. Therefore, the first part PA1 is fully movable relative to the second part PA2. Within the context of use for timing swimmers, the first part PA1 is fixed to the pad and the second part PA2 is fixed opposite the wall, or vice versa. When a force is applied to the pad PL, the pad PL moves towards the wall, moving the first part PA1 towards the second part PA2. It is to be noted that in this embodiment, the second part PA2 may not comprise suspension means BR, PT, and that if the second part PA2 comprises suspension means, then these suspension means are not fixed to the first part PA1.

Figure 2:
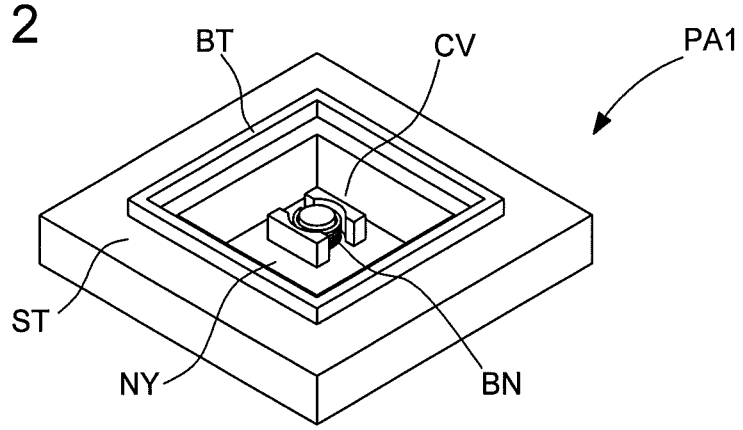
FIG. 2 shows the first part only.
Figure 3:
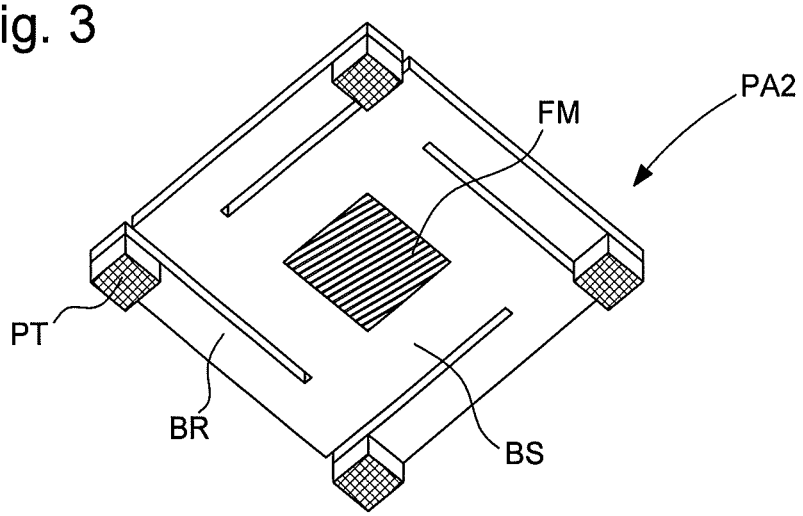
FIG. 3 shows the second part only.

FIGS. 2 and 3 respectively show the first part PA1 and the second part PA2.

As shown in FIGS. 1 and 2, the first part PA1 comprises a structure ST with a substantially square cross section (but which can be a different shape), at the centre of which a cavity CV is hollowed out. The coil BN is positioned in the cavity CV, as is a ferromagnetic core NY for the coil BN. The core NY is formed, for example, by ferrite or by an assembly of metal sheets. Alternatively, the core NY is formed by amorphous metal, which is mechanically more resistant to elastic deformations than the aforementioned materials.

As shown in FIG. 1, the first part PA1 comprises means MS for sealing the cavity CV. With the electronic detection circuit and the coil BN being placed in the cavity CV, it is important to guarantee the seal thereof. However, the sealing means MS must not disrupt the magnetic fields. Furthermore, the sealing means MS must be wear resistant. Sealing means MS formed by a glass or ceramic plate address these constraints. The plate MS is, for example, soldered, brazed, fitted with or without a seal, or adhered to the adjacent walls of the cavity CV, so as to enclose the cavity.

As shown in FIGS. 1 and 3, the second part PA2 comprises a square cross-sectional base BS, at the centre of which the amorphous metal plate FM is placed. It is to be noted that the base BS must be thick enough to withstand the maximum pressures exerted on the sensor. For example, the thickness is 1.4 millimetres and the other two dimensions are 25 millimetres.

Furthermore, the amorphous metal plate FM is also substantially square and is fixed to the centre of the base BS. Of course, the base BS and the metal plate FM can assume any other shapes.

As previously mentioned, the base BS comprises suspension means BR, PT capable of deforming when a force F is applied to the base BS orthogonally to the amorphous metal plate FM. This deformation allows a translational movement of the amorphous metal plate FM along the axis Z of the coil BN. In the example shown, the suspension means BR, PT are formed by four arms BR formed by machining (by laser, for example) in the base BS, each of the arms BR extending along one of the edges of the base BS and comprising a contact pad PT at one of its ends. Of course, other types of suspension means can be used such as springs, for example.

In one embodiment, the base BS further comprises a stiffening plate RD that is placed on the side opposite the contact pads PT and allows the zone on which the amorphous metal plate FM is located to be strengthened.

Since the sealing means MS are naturally fragile and brittle, the pressing force of the amorphous metal plate FM and of the base BS on said means needs to be limited or completely avoided. To this end, the sealing means MS are contained inside a stop BT, which is formed in the structure ST and the height of which is slightly greater than the thickness of the sealing means MS so as not to require an excessively high minimum gap. The position and the width of the stop BT are arranged so as to allow a minimum overlap of the sealing means MS beyond the cavity CV and to avoid contact between the stop BT and the bending arms BR.

Of course, the present invention is not limited to the embodiment shown but is applicable to various variations and modifications apparent to a person skilled in the art.

The invention claimed is:

1. A force sensor comprising:
   a first part comprising a detection coil;
   a second part positioned opposite the first part and comprising:
      a ferromagnetic plate that is translationally movable relative to the first part to move towards the first part when a force is transferred to the force sensor and to reduce reluctance of a magnetic circuit formed by the first and second parts in series with a variable gap;
      an electronic detection circuit configured to generate a signal dependent on the reluctance of the magnetic circuit;
   wherein the ferromagnetic plate is formed by an amorphous metal alloy.

2. The force sensor as claimed in claim 1, wherein thickness of the ferromagnetic plate is between 20 and 200 micrometers.

3. The force sensor as claimed in claim 1, the first part comprising a ferrite core, the coil being placed inside the core.

4. The force sensor as claimed in claim 3, the coil and the core being flat.

5. The force sensor as claimed in claim 1, the second part comprising a base comprising suspension means rigidly connected to the ferromagnetic plate.

6. The force sensor as claimed in claim 5, the suspension means being fixed to the first part, the ferromagnetic plate being translationally movable relative to the first part by the suspension means.

7. The force sensor as claimed in claim 5, the suspension means comprising:
   arms formed by cutting in the base, each arm comprising an end;
   contact pads, such that each contact pad is fixed to each end of a respective of the arms.

8. The force sensor as claimed in claim 1, the first part comprising sealing means and a structure comprising a cavity, the coil and the detection circuit being enclosed inside the cavity by the sealing means.

9. The force sensor as claimed in claim 8, the sealing means including a plate that is made of glass, ceramic or another crystalline inorganic material and fixed to the structure.

10. The force sensor as claimed in claim 9, the structure including a stop, the stop framing the cavity, height of the stop being greater than thickness of the plate of the sealing means.

11. A swimmer timing system, comprising:
a touch pad positioned on a finishing wall of a swimming pool and the force sensor as claimed in claim 1, the force sensor being positioned between the finishing wall and the touch pad so that a force exerted on the touch pad is transferred to the ferromagnetic plate.

12. The timing system as claimed in claim 11, comprising a plurality of sensors, arranged in a matrix formed between the finishing wall and the touch pad.

* * * * *